(12) United States Patent
Harada et al.

(10) Patent No.: US 7,157,210 B2
(45) Date of Patent: Jan. 2, 2007

(54) PLATE-MAKING METHOD, PLATE-MAKING APPARATUS USED IN SUCH PLATE-MAKING METHOD, AND IMAGE RECORDING MATERIAL

(75) Inventors: Akinori Harada, Minami-Ashigara (JP); Nobufumi Mori, Minami-Ashigara (JP)

(73) Assignee: Fuji Photo Film Co.-, Ltd., Kanagawa (JP)

( * ) Notice: Subject to any disclaimer, the term of this patent is extended or adjusted under 35 U.S.C. 154(b) by 193 days.

(21) Appl. No.: 10/866,800

(22) Filed: Jun. 15, 2004

(65) Prior Publication Data

US 2004/0244620 A1   Dec. 9, 2004

Related U.S. Application Data

(62) Division of application No. 09/726,507, filed on Dec. 1, 2000, now Pat. No. 6,767,685.

(30) Foreign Application Priority Data

Dec. 3, 1999 (JP) ............................... 11-344629
Dec. 10, 1999 (JP) ............................... 11-351269

(51) Int. Cl.
  G03F 7/00    (2006.01)
  G03F 7/207   (2006.01)
  G03F 7/24    (2006.01)
(52) U.S. Cl. .................. 430/300; 430/945; 430/306
(58) Field of Classification Search .............. None
  See application file for complete search history.

(56) References Cited

U.S. PATENT DOCUMENTS

| 4,093,852 | A  |   | 6/1978  | Olive et al. |
| 4,486,529 | A  | * | 12/1984 | Jeffers et al. ............... 430/300 |
| 5,526,171 | A  | * | 6/1996  | Warren ........................ 359/285 |
| 5,761,111 | A  | * | 6/1998  | Glezer ......................... 365/108 |
| 6,020,591 | A  | * | 2/2000  | Harter et al. ............. 250/458.1 |
| 6,136,611 | A  |   | 10/2000 | Saaski et al. |
| 6,295,123 | B1 |   | 9/2001  | Wang |
| 6,573,026 | B1 |   | 6/2003  | Aitken et al. |
| 6,696,221 | B1 | * | 2/2004  | McLean et al. ............. 430/306 |
| 2002/0074320 | A1 |   | 6/2002 | Lineta |
| 2004/0075883 | A1 | * | 4/2004 | Galvanauskas et al. ..... 359/330 |

FOREIGN PATENT DOCUMENTS

| EP | 0 549 486 | 6/1993 |
| JP | 3-69949 | 3/1991 |
| JP | 5-164982 | 6/1993 |
| JP | 7-13740 | 2/1995 |
| WO | WO 98/21521 | 5/1998 |
| WO | WO 99/53242 | 10/1999 |
| WO | WO 9954784 A1 * | 10/1999 |

OTHER PUBLICATIONS

"Modulate", "amplitude", "frequency", "phase", 11 pages from yourDictionary.com, Copyright 1996-2002, yourDictionary.com Merriam-Websters Collegiate Dictionary.

* cited by examiner

*Primary Examiner*—Cynthia Hamilton
(74) *Attorney, Agent, or Firm*—Sughrue Mion, PLLC

(57) ABSTRACT

A plate-making method is capable of recording a sharp image on a photosensitive plate, and is applicable to a process operation executed in a light room, while adverse influences caused by laser flares can be hardly received. Ultra-short pulse laser light emitted from a Ti:Al$_2$O$_3$ laser light source is modulated by an AOM (acousto-optic modulating element). The modulated laser light is focused by a collective lens onto a high-sensitive photopolymer layer of a photosensitive plate-making material. The focused ultra-short pulse laser light may cause a photopolymerization reaction in a laser-light-irradiated portion of the high-sensitive photopolymer layer by way of a multiple photon absorption phenomenon, so as to form a hardened portion.

6 Claims, 6 Drawing Sheets

8: R=-OMe,n=1
9: R=-OMe,n=2

WHITE COLOR(W)

WARM WHITE COLOR(WW)

DAYLIGHT COLOR(D)

INCANDESCENT LAMP COLOR

PLATE-MAKING METHOD, PLATE-MAKING APPARATUS USED IN SUCH PLATE-MAKING METHOD, AND IMAGE RECORDING MATERIAL

This is a divisional of application Ser. No. 09/726,507 filed Dec. 1, 2000 now U.S. Pat. No. 6,767,685.

BACKGROUND OF THE INVENTION

1. Field of the Invention

The present invention generally relates to a method for forming a printing plate used in a planographic (lithographic) printing operation and the like. More specifically, the present invention is related to such a plate-making method capable of recording a sharp image without being adversely influenced by laser flare, and also applicable to a process operation executed in a light room. Furthermore, the present invention is directed to a plate-making apparatus used in a plate making method, and an image recording material such as a photosensitive plate-making material.

2. Description of the Related Art

While a CTP (computer-to-plate) plate-making system (will be simply referred to as a "CTP system" hereinafter) is employed as an example, conventional techniques of plate-making methods will now be described. This CTP system corresponds to such a system that while image information stored in a computer is recorded on a photosensitive plate-making material by using a laser scanner and the like, the recorded image is developed to form a printing plate. In this CTP system, printing intermediate films with respect to the respective colors employed in the known photolithography process is no longer required. As a result, this CTP system may constitute a considerably attractive system having such various merits, for instance, low cost, high-speed processing, and high image qualities.

Very recently, two different types of photosensitive plate-making materials, namely, 1) high-sensitivity photopolymer plate-making material and 2) thermal photosensitive plate-making material, have been positively developed in this CTP system in conjunction with great progresses of laser light sources used to expose these plate-making materials. In the current CTP systems with employment of the above-explained photosensitive plate-making materials, the below-mentioned problems may occur:

1) One conventional CTP system with employment of the above-explained high-sensitivity photopolymer plate-making material:

Normally, this CTP system employs as exposure light, laser light having power of approximately 100 mW to 200 mW and having wavelengths from UV (ultraviolet) to blue/green, which is produced from either an $Ar^+$ laser or an LD-excited green solid-state laser. This CTP system may have merits of processing/printing aptitude similar to those of the conventional system using the PS (Pre-Sensitized) plate corresponding to the photosensitive plate-making material.

However, in this CTP system, since the laser light having the wavelengths from UV to blue/green and the high sensitive photopolymer are employed, the adverse influences of the laser flares are apt to be caused by laser light scattering phenomenon, laser light reflections, and laser light diffraction, which occurred in the optical system and the photosensitive planes. As a result, the resultant image qualities may be easily deteriorated. Also, in the case that the laser light of blue/green color is employed as the exposure light, both the exposure process and the developing process of the plate are required to be performed in a dark room. Namely, darkroom process operation is required.

2) Another conventional CTP system with employment of the above-described thermal photosensitive plate-making material:

A thermal photosensitive plate-making material is classified into both a thermal/negative photosensitive plate-making material and a thermal/positive photosensitive plate-making material. Since these photosensitive plate-making materials own very low sensitivities, these plate-making materials are not photosensitized by the normal illumination light, although high power laser light in the class of 1 W to low must be irradiated to these very low sensitive plate-making materials. Therefore, these photosensitive plate-making materials can be handled in a light room.

However, since a very large oven is necessarily required in a pre-heat stage with respect to such a thermal/negative photosensitive plate-making material, a processing system thereof becomes bulky. Furthermore, this thermal/negative photosensitive plate-making material owns another problem that a latitude or a permissible range with respect to a heating temperature in a heating stage is narrow, and also very cumbersome temperature controls are necessarily required. On the other hand, in the case that a thermal/positive photosensitive plate-making material is employed in the CTP system, although a heating stage is not required, there is such a problem that a latitude of a developing process is narrow and also very strict management is required with respect to the developing conditions. Further, these two thermal photosensitive plate-making materials own a certain drawback as to stability for a long time period.

SUMMARY OF THE INVENTION

The present invention has been made to solve the above-explained problems, and therefore, has an object to provide a plate-making method capable of recording a sharp image on a photosensitive material, while an adverse influence caused by laser flare can be hardly given, and also capable of being applied to a process operation executed in a light room. Furthermore, another object of the present invention is to provide a plate-making apparatus used in such a plate-making method, and also to provide an image recording material such as a photosensitive plate-making material.

To solve the above-described problems of the prior art, a plate-making method according to one aspect of the present invention comprises the steps of: preparing a photosensitive plate-making material; scanning the photosensitive plate-making material by using modulated laser light so as to record an image on the photosensitive plate-making material, the laser light including ultra-short pulse laser light which causes photopolymerization reaction by a multiple photon absorption phenomenon at a laser-light-irradiated portion of the photosensitive plate-making material; and developing the image recorded on the photosensitive plate-making material.

Also, a plate-making apparatus according to one aspect of the present invention is a plate-forming apparatus for scanning a photosensitive plate-making material by using modulated laser light to record an image on the photosensitive plate-making material, comprising: a light source for generating laser light including ultra-short pulse laser light which causes photopolymerization reaction by a multiple photon absorption phenomenon at a laser-light-irradiated portion of the photosensitive plate-making material; a light modulator for modulating the laser light generated by the light source; and a light scanning mechanism for scanning the laser light modulated by the light modulator.

Furthermore, an image recording material according to one aspect of the present invention comprises: a photosensitive film made of a photopolymer photosensitive material, for causing photopolymerization reaction by a multiple photon absorption phenomenon when recording laser light is irradiated onto the photosensitive film; and a filter film formed on the photosensitive film, for cutting off such light having a wavelength shorter than that of the recording laser light.

As an example of the multiple photon absorption phenomenon, a description will now be made of a two-photon absorption phenomenon. This two-photon absorption phenomenon implies such a phenomenon that since a light absorption member absorbs two pieces of photon at the same time, such absorption may occur which is equivalent to energy (½ wavelength) two times higher than that of actually irradiated light. In this phenomenon, for instance, when femtosecond laser light having an infrared wavelength of 760 nm is irradiated, such a light absorption occurs which is equivalent to irradiation of light having a UV wavelength of 380 nm. It should be noted that the unit of "femto" is equal to $10^{-15}$.

It should be understood that an occurrence probability of such a two-photon absorption phenomenon is very low, as compared with that of a one-photon absorption phenomenon in the case that light having a general light intensity is irradiated. However, since the occurrence probability of the two-photon absorption phenomenon is directly proportional to a squared value of the irradiation light intensity, if the irradiation light intensity is increased so as to considerably increase the photon density, then the induction of the two-photon absorption phenomenon becomes active. In such a case that laser light is made of a ultra-short pulse laser, the photon density becomes very large, so that peak laser power higher than, or equal to 1 kW/cm$^2$ can be easily produced. In this case, the two-photon absorption phenomenon may occur in a practical level. Also, as previously explained, since the occurrence probability of the two-photon absorption phenomenon is directly proportional to the illumination light intensity, the two-photon absorption phenomenon may occur only at a focal position where laser light is focused.

According to the present invention, such a photosensitive material can be employed based upon the basic idea of the multiple photon absorption phenomenon. This photosensitive material owns such a sensitivity with respect to light having a wavelength equal to a half (otherwise shorter than ½) of the wavelength of the irradiation laser light. In other words, such laser light having the wavelength two times longer than the photosensitive wavelength of the photosensitive material can be employed. As a consequence, the adverse influences of the laser flares which are caused by the diffraction and scattering phenomena of the laser light can be mitigated, which may especially cause a serious problem when the laser light having the short wavelength is employed. Accordingly, the following problems can be considerably solved in the non-image formed portion in the recorded image, or the recorded plate-making material. As to these problems, there are colors and films remained in the non-image formed portion, dirty portions of the plate material, thickening of halftone dots and lines, and fringes around the halftone dots.

Also, as explained above, since the occurrence probability (absorption amount) of, for example, the two-photon absorption phenomenon is directly proportional to the squared light intensity, the focal point of the laser light can be narrowed, so that the multiple photon absorption phenomenon may occur only the area in the vicinity of this focal point so as to expose the photosensitive material. As a consequence, the high resolution can be achieved.

In general, a photosensitive wavelength of photopolymer is 400 nm or shorter (namely, ultraviolet exposure range). Such photopolymer for the ultraviolet exposure range owns low sensitivities with respect to visible illumination light. As a consequence, this photopolymer may be exposure-processed in a light room, or a semi-light room where light having wavelengths higher than or equal to yellow wavelength is employed as illumination light, so that the processing efficiency of this photopolymer can be largely improved.

BRIEF DESCRIPTION OF THE DRAWINGS

For a better understanding of the present invention, reference is made of a detailed description to be read in conjunction with the accompanying drawings, in which.

DESCRIPTION OF THE PREFERRED EMBODIMENTS

Figure 1:
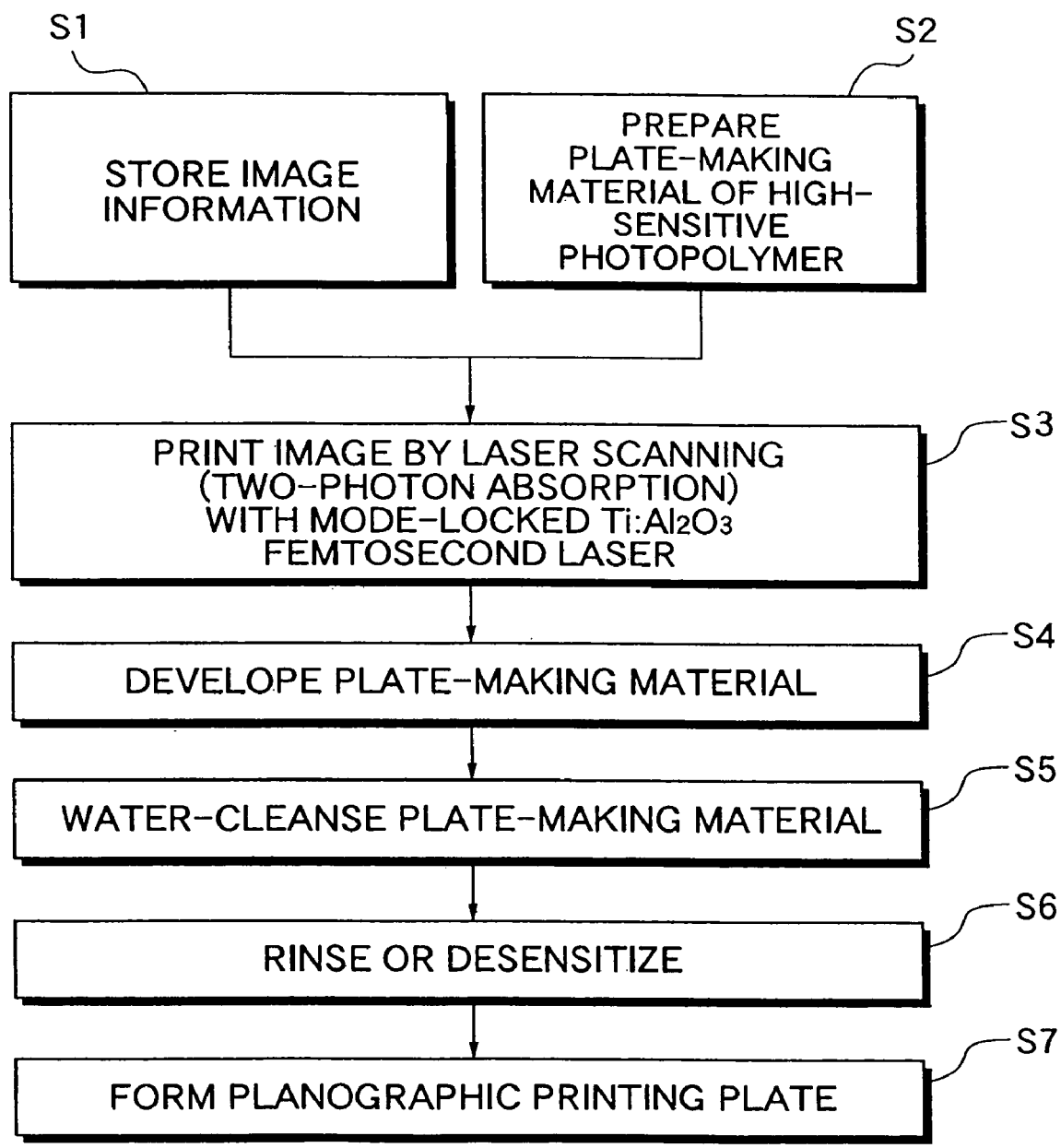
FIG. 1 is a flow chart for describing a plate-making method according to an embodiment of the present invention.

Referring now to drawings, various preferred embodiments of the present invention will be described in detail. It should be understood that the same reference numerals will be employed as those for denoting the same, or similar structural elements.

Figure 2A:
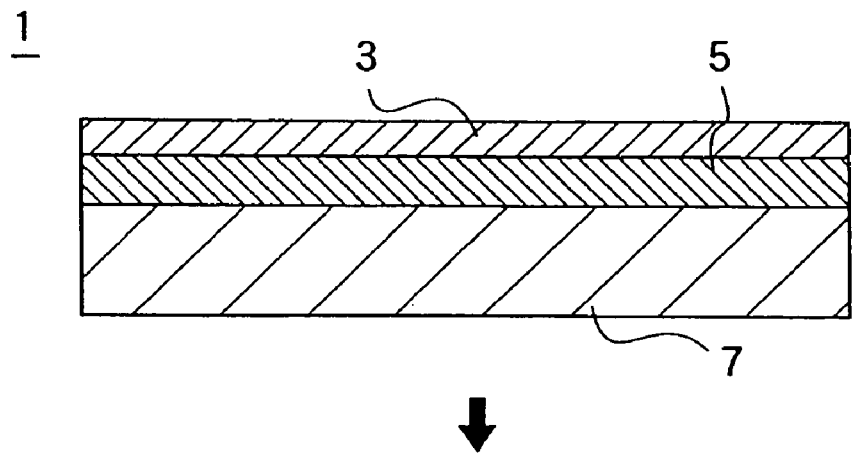
FIGS. 2A–2C are diagrams for schematically indicating a treatment process of a photosensitive sensitive plate-making material made by the plate-making method as shown in FIG. 1.
Figure 2B:
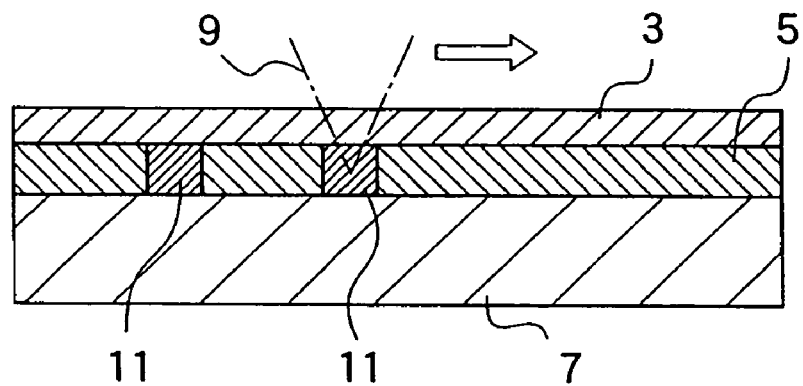
Figure 2C:
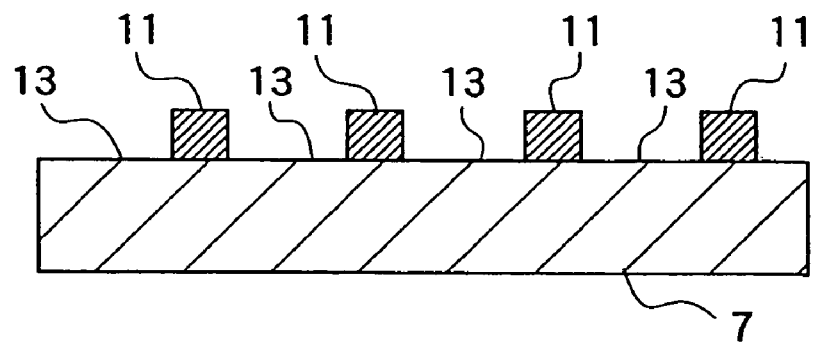

First, a plate-making method according to an embodiment of the present invention will now be explained with reference to FIG. 1 and FIGS. 2A–2C. FIG. 1 is a flow chart for describing a plate-making method according to an embodiment of the present invention. FIGS. 2A–2C are diagrams for schematically indicating a treatment process of a photosensitive plate-making material made by the plate-making method as shown in FIG. 1.

Referring to the flow chart of FIG. 1, at step S1, image information is stored in a computer. In this operation, an original image is optically read by using a scanner, or CAD (computer-aided design) information as well as electronic photographic information is received so as to be stored in the computer.

At step S2, a photosensitive plate-making material made of high sensitive photopolymer is prepared.

As indicated in FIG. 2A, a photosensitive plate-forming material 1 is formed as follows: A photopolymer layer 5 is formed on a base plate 7 made of aluminum, or resin, and an overcoat layer 3 is formed on this photopolymer layer 5. The overcoat layer 3 is made of either polyvinyl alcohol or acid cellulose. The function of this overcoat layer 3 can avoid such a fact that photopolymer is reacted with oxygen and the like contained in air to be thereby polymerized.

At step S3 (see FIG. 1), as will be explained later in detail, the surface of the photosensitive plate-making layer 1 is scanned in a two-dimensional manner by way of modulated laser light by employing a laser scanner, so that an image is printed on this scanned photosensitive plate-making material 1. At this time, as indicated in FIG. 2B, for instance, femtosecond laser light 9 having an infrared wavelength of 760 nm is irradiated in such a manner that this laser light 9 may be focused on the photopolymer layer 5. Then, this laser light 9 causes photopolymerization reaction to occur in the vicinity of this focal point in order that a selected portion within the photopolymer layer 5 is hardened (see hardened portion 11).

At step S4, the printed photosensitive plate-making material 1 is developed by using a developing fluid. This developing fluid is made from a potassium silicate water solution, and is capable of melting an unhardened portion of the photosensitive layer. As a result, as represented in FIGS. 2B and 2C, both the overcoat layer 3 and the unhardened photopolymer layer 5 are removed, so that an image constituted by the hardened portion 11 may be formed on the base plate (supporting member) 7. It should be noted in the normal printing plate, the hardened portion 11 constitutes a so-called "halftone dot gradation." It should also be noted that although the positive type photosensitive plate-making material is employed in the above-explained example, a negative type photosensitive plate-making material may be apparently employed in the plate-making method of the present invention.

At step S5, the photosensitive plate-making material 1 is cleansed by using water so as to wash the developing fluid and the like.

At step S6, this photosensitive plate-making material 1 is treated by way of the rinse process by using a water solution containing surface active agent or by way of the desensitization process by using gum fluid. Alternatively, both the rinse process and the desensitization process may be employed.

The compositions as to the above-described developing fluid, rinse fluid, and gum fluid used in the desensitization process, and further the above-explained developing apparatus are known in this technical field, for example, in Japanese Patent Publication JP-B-7-13740 published in 1995.

As to the planographic (lithographic) printing plate manufactured in the above-explained manner, the hardened portion 11 of photopolymer represents a high lipophilic property, and the remaining portion 13 represents a hydrophilic property. In the subsequent printing stage, wetting water is applied to the printing plate 1 and ink is applied to the hardened portion 11. This ink may be directly transferred to a paper to be printed, or may be transferred via a blanket body to a paper to be printed so as to print the image on the paper.

Next, a plate-making apparatus according to an embodiment of the present invention will now be explained with reference to FIG. 3 to FIG. 5. This plate-making apparatus includes a plate-making image recording apparatus used to print image information on a photosensitive plate-making material. It should be understood that "upper", "lower", "left", and "right" directions represents directions in the respective drawings in the below-mentioned specification.

Figure 3:
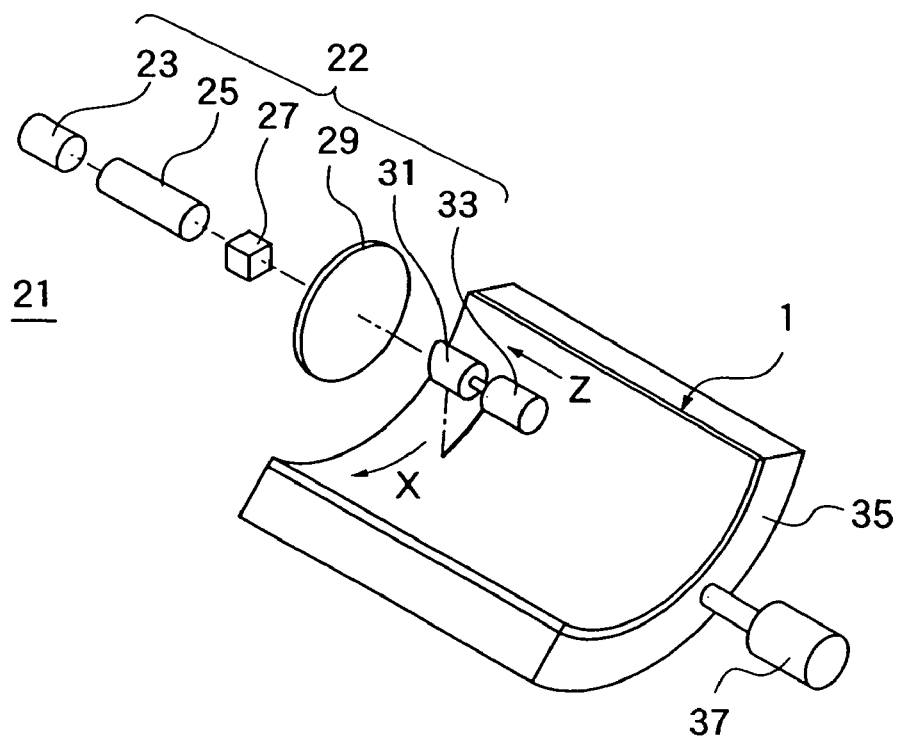
FIG. 3 is a perspective view for schematically representing a structure of an inner drum type plate-making image recording apparatus which is usable in a plate-making apparatus according to an embodiment of the present invention.

FIG. 3 is a perspective view for schematically indicating a construction of an inner drum type plate-making image recording apparatus which may be used in the plate-making apparatus according to one embodiment of the present invention.

In this image recording apparatus 21, the photosensitive plate-forming material 1 is attached to an inner surface of a drum 35 having a cylindrical inner surface. This drum 35 is driven by a drum moving mechanism 37 to be moved along a Z direction shown in this drawing (namely, direction along drum shaft center).

An optical system 22 of this image recording apparatus 21 contains a laser light source 23, another laser light source 25, and AOM (acousto-optic modulation element) 27, a collective lens 29, and a rotary mirror 31. The LD-excited green solid-state laser light source 23 arranged at an end of the optical system 22 emits excitation-purpose laser light toward the Ti:Al$_2$O$_3$ laser light source 25 which is juxtaposed with the LD-excited green solid-state laser light source 23. This Ti:Al$_2$O$_3$ laser light source 25 is equipped with a mode lock mechanism (not shown), and oscillates such laser light having a very short (ultra-short) pulse width defined from 100 fs to 300 fs. The wavelength of the laser light emitted from this laser light source 25 may be swept from 700 nm up to 900 nm. As the assemblies of the laser light sources 23 and 25 which are provided with such a mode lock mechanism and such a wavelength sweeping mechanism, for instance, the laser assembly named "Tsunami" marketed by SPECTRA PHYSICS cooperation may be employed.

The ultra-short pulse laser emitted from the Ti:Al$_2$O$_3$ laser light source 25 is entered into the AOM 27 which may externally modulate laser light. This AOM 27 includes a transducer, a crystal body, and the like.

The crystal body corresponds to an ultrasonic medium. In response to ultrasonic waves produced from the transducer, density variations occur in this crystal body, and thus, the density variations of this crystal body may be utilized as diffraction grating. This crystal body projects the incident laser light along a direction at an angle corresponding to order number of this diffraction. The first-order diffraction light for the printing operation, which is derived from the AOM 27, is traveled along the direction of the collective lens 29. In other words, a selection is made as to whether or not the laser light for the printing operation is projected to the direction of the collective lens 29 by controlling a voltage applied to the transducer of the AOM 27.

The first-order diffraction light traveled from the AOM 27 is converged by the collective lens 29. As previously explained, the convergence focal point is adjusted to be positioned on the photopolymer layer 5 (see FIG. 2B) of the photosensitive plate-making material 1.

The laser light derived from the collective lens 29 is entered into a rotary mirror 31. The rotary mirror 31 is rotated in a high speed by receiving drive force given from the motor 33 around the same shaft as the shaft center of the plate-making material drum 35. A plane of the rotary mirror 31 on the side of the collective lens 29 constitutes such a plane which is inclined by 45 degrees with respect to the shaft center. The laser light which impinges on this plane is deflected toward the surface of the photosensitive plate-making material 1. The position of the laser light which impinges on the photosensitive plate-making material 1 is varied, depending upon the rotation of the rotary mirror 31, so that the laser light is scanned along the X direction as shown in this drawing. It should also be noted that since the photosensitive plate-making material 1 is scanned in combination with the drum 35 along the Z direction, the laser light may be scanned on the photosensitive plate-making material 1 in the two-dimensional manner in conjunction with the deflection scanning operation of the laser light.

In the image recording apparatus of FIG. 3, the femto-second laser light having the infrared wavelength of 760 nm, which is emitted from the Ti:Al$_2$O$_3$ laser light source 25 is external-modulated by the AOM 27, and then the modulated laser light is traveled via the collective lens 29 and the rotary mirror 31 to so as to scan the surface of the photosensitive plate-making material 1. Thereafter, this modulated laser light is focused onto the photopolymer layer 5 (see FIG. 2B) formed on the photosensitive plate-making material 1. At this time, a multiple photon absorption phenomenon, for instance, a two-photon absorption phenomenon occurs, so that chemical changes (photopolymerization reaction) corresponding to the absorption of UV wavelength of 380 nm occur.

It should also be noted that as the ultra-short pulse laser light source, in addition to the Ti:Al$_2$O$_3$ laser, a femtosecond fiber laser using a Er-doped fiber and a CPM laser using dye may be employed.

Figure 4:
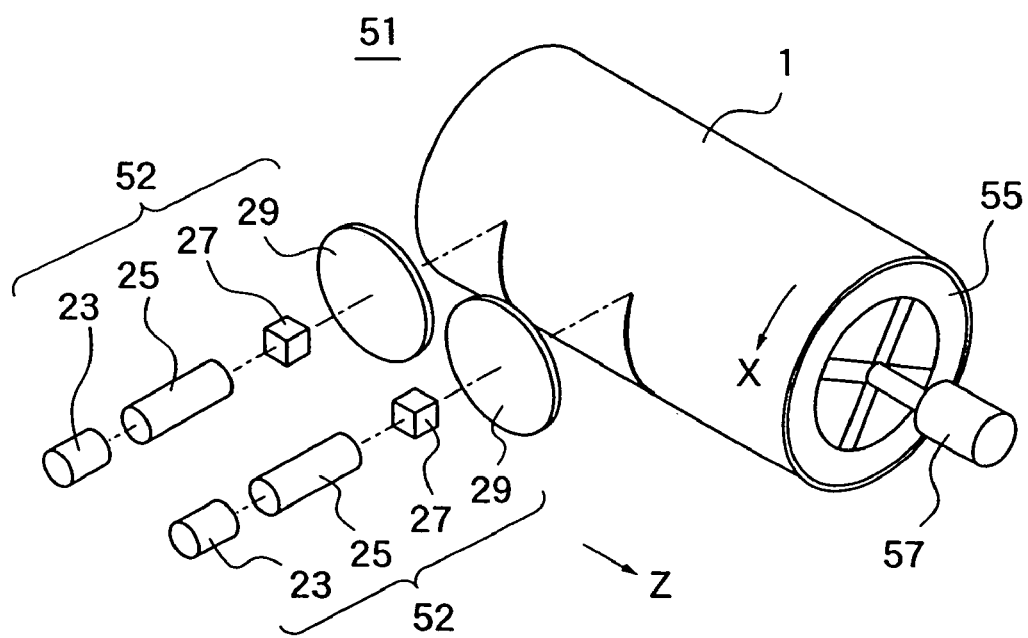
FIG. 4 is a perspective view for schematically representing a structure of an outer drum type plate-making image recording apparatus which is usable in a plate-making apparatus according to an embodiment of the present invention.

FIG. 4 is a perspective view for schematically showing an outer drum type plate-making image recording apparatus which may be used in a plate-making apparatus according to an embodiment of the present invention.

In this outer drum type plate-making image recording apparatus, an optical system 52 is the same as the optical system 22 of the inner drum type image recording apparatus as shown in FIG. 3, except that both the rotary mirror 31 and the motor 32 indicated in FIG. 3 are not employed in this outer drum type image recording apparatus. In this image recording apparatus of FIG. 4, since two series of such an optical system 52 are provided, a shortage of image drawing speeds may be compensated.

In the image recording apparatus as shown in FIG. 4, the photosensitive plate-making material 1 is attached, or adhered to an outer surface of a drum 55 having a cylindrical outer surface. This drum 55 is rotated along the X direction as shown in this drawing by a rotation mechanism 57 containing a motor and a reduction gear.

Two series of these optical systems 52 emit laser light along two fixed directions, and then two sets of laser light are focused onto the surface of the photosensitive plate-making material 1. While an image is recorded on this photosensitive plate-making material 1, the entire unit of the optical systems 52 is scanned along the Z direction of this drawing (namely, direction parallel to shaft center of drum 55). As a result, the laser light may be scanned in the two-dimensional manner over the entire surface of the photosensitive plate-making material 1 by rotating the drum 55 along the X direction and by scanning the optical system 52 along the Z direction.

Figure 5:
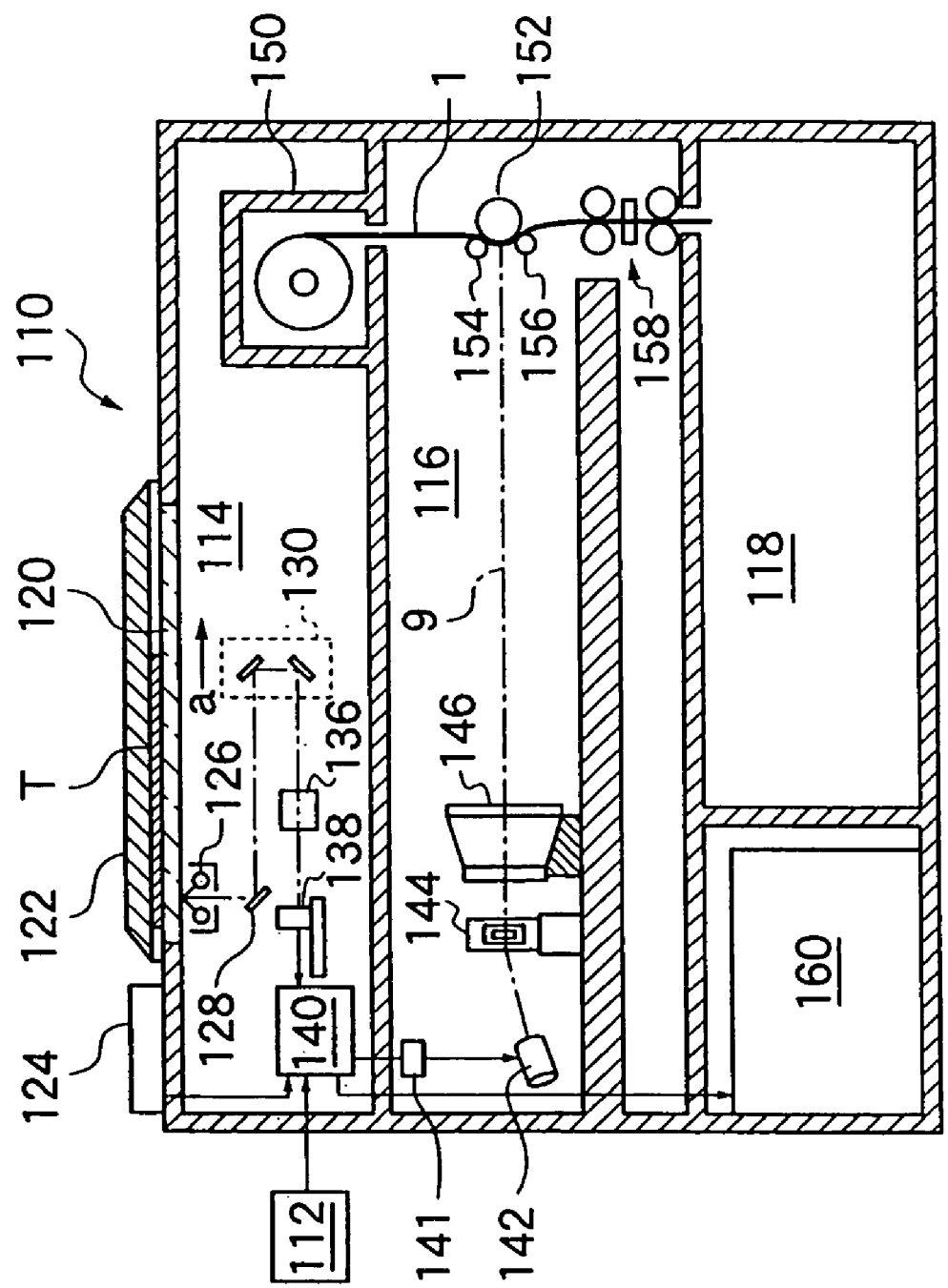
FIG. 5 is a sectional view for schematically representing an arrangement of an automatic plate-making apparatus according to an embodiment of the present invention.

FIG. 5 is a sectional view for schematically indicating a construction of an automatic plate-making apparatus according to an embodiment of the present invention. This plate-making apparatus includes a flat bed type image recording unit for plate-making use.

As shown in FIG. 5, an internal space within this automatic plate-making apparatus 110 is subdivided into three layers. In these three layers, a reading unit 114, an image recording unit 116, a plate-making material processing unit 118, and a data acquiring unit 160 are arranged in this order from the upper layer to the lower layer. While an original "T" is positioned on an original plate 120 provided on an upper surface of this plate-making apparatus 110, either the image formed on this original "T" on an image entered from the computer 112 is recorded on the photosensitive plate-making material 1 (either film photosensitive plate-making material or paper photosensitive plate-making material) so as to form either a film plate or a paper plate.

The original plate 120 is mounted at a position substantially same as a central position of an upper surf ace of a main body of this automatic plate-making apparatus 110. After the original "T" is set onto the original plate 120, this original "T" is depressed by an original cover 122. A condition input unit 124 is mounted on the left side of the upper surface of the above-described main body. This condition input unit 124 is used to enter various process conditions by an operator. These process conditions are related to the various reading and output process conditions, for instance, an image reading range and an output image magnification of the original "T", and specific process conditions such as trimming process and grain process. After these conditions are input via the condition input unit 124 and the original "T" is mounted on the original plate 120, the operator pushes a start button (not shown) and then the image reading operation of the original "T" is commenced by the reading unit 114.

When the start switch is pushed by the operator, while a reading light source 126 employed in the reading unit 114 of this automatic plate-making apparatus 110 is moved along a direction indicated by an arrow "a" (namely, direction parallel to lower surface of original plate 120), this reading light source 126 irradiates reading light to the original "T" so as to scan this original "T". A mirror 128 is positioned under the reading light source 12, and a mirror unit 130 is positioned on the right side of this mirror 128.

The mirror 128 is transported in synchronism with the reading light source 126 in such a manner that this mirror 128 is always located under this reading light source 126. The mirror unit 130 is transported along the same direction as the transport direction of the reading light source 126 at a half speed of the transport speed of this reading light source 126. The reflection light from the original "T" is reflected on the mirror 128 and the mirror unit 130, and thereafter, is reached to a focusing lens 136.

The focusing lens 136 may adjust the focal distance of the reflection light from the mirror unit 130. A CCD sensor 138 is arranged on the left side of this focusing lens 136. This CCD sensor 138 optically reads out the light whose focal distance has been adjusted, and then photoelectrically converts this read light so as to acquire the image information of the original "T".

An image information processing apparatus 140 is arranged on the left side of the CCD sensor 138. Either the image information (namely, image of original "T") derived from the CCD sensor 138 or image information supplied from a computer 112 is entered to this image information processing apparatus 140. In response to the input condition of the condition input unit 124, the image information processing apparatus 140 processes the image information entered from either the CCD sensor 138 or the computer 112 so as to produce halftone dot image information. This image information processing apparatus 140 is connected to the data acquiring unit 160.

The image recording unit 116 of this automatic plate-making apparatus 110 conducts the flat bed scanning type image recording unit, and records the image on the photosensitive plate-making material 1. A driver 141 of the image recording unit 116 receives the halftone dot image information entered from the image information processing apparatus 140, and then drives an exposure light source 142 in accordance with this halftone dot image information. The exposure light source 142 is arranged by an LD-excited green solid-state laser light source, a Ti:$Al_2O_3$ laser light source, an AOM, and a collective lens, which are not shown in this drawing, similar to the above-explained example as shown in FIG. 4. This exposure light source 142 emits recording light (laser light) 9 produced based upon the halftone dot image information toward a resonant scanner 144.

The resonant scanner 144 corresponds to a so-called "optical deflector", and deflects the laser light 9 emitted from the exposure light source 142 along a main scanning direction (namely, vertical direction as viewed in drawing plane of FIG. 5). An "Fθ" lens 146 is arranged on the right side of the resonant scanner 144. This "Fθ" lens 146 may adjust a focal position of the laser light 9 from the resonant scanner 144 so as to focus the laser light 9 onto the photosensitive plate-making material 1.

On the right side of the image recording unit 116, the photosensitive plate-forming material 1 is wound in a roll shape which is stored in a magazine 150. The photosensitive plate-making material 1 is pulled out from the magazine 150, and is held at a predetermined exposure position by the exposure drum 152. While this photosensitive plate-making material 1 is maintained at this exposure position, this material 1 is transported by this exposure drum 152 and nip rollers 154 and 156 along a lower direction, namely the sub-scanning direction which is substantially perpendicular to the main scanning direction. Since the laser light 9 is scanned along both the main scanning direction and the sub-scanning direction, the entire surface of the photosensitive plate-making material 1 is scanned by this laser light 9 in the two-dimensional manner, so that such an image is recorded on the scanned photosensitive plate-making material 1 in response to the halftone dot image information acquired by the image information processing apparatus 140.

After the photosensitive plate-making material 1 on which the image is recorded is cut by a cutter 158 by a predetermined length, the cut photosensitive plate-making material 1 is transported to a plate material processing unit 118. The photosensitive plate-making material 1 which is transported to the plate material processing unit 118 is processed through steps which are determined in accordance with the sort of the photosensitive plate-making material 1. Thereafter, the processed photosensitive plate-making material 1 is ejected onto a tray (not shown). For instance, in the case that a silver halide photographic photosensitive material is employed as this photosensitive plate-making material 1, this silver halide photographic photosensitive material is processed by a developing step, a bleaching/fixing step, a water cleansing step, and then, a drying step. Thereafter, the processed photosensitive material is ejected to the tray.

It should be understood that the plate-making apparatus according to the present invention is not limited to such an automatic plate-making apparatus as shown in FIG. 5, but also may be applied to all of plate-making apparatuses for making such printing plates, for example, PS plates, silver halide photographic plates, and electronic photographic plates. Also, the present invention may be applied to all of plate-making apparatuses to which various sorts of plate-making materials are applied.

As previously explained in detail in accordance with the plate-making apparatus according to the present invention, since the laser light having the ultra-short pulse width is employed in the exposure process operation, the photosensitive plate can be formed by employing the photosensitive material having such a sensitivity sensible to such light having a wavelength shorter than, or equal to a half wavelength of the irradiation laser light. As a result, the adverse influences caused by the laser flares can be hardly given to this plate-making method/apparatus, so that the following problems can be largely solved in the non-image formed portion in the recorded images or the recorded plate-making material, and also the image can be readily obtained in high resolution. As to the above-explained problems, there are colors and films remained in the non-image formed portion, dirty portions of the plate material, thickening of halftone dots and lines, and fringes around the halftone dots.

In this case, when the pulse width of the ultra-short pulse laser is made narrower than or equal to 10 ps, while the photosensitive material is not influenced by the thermal adverse effect at all, the photosensitive material can be exposed so that the edge portions between the exposed portion and the unexposed portion become sharp. Thus, the image having higher resolution can be recorded.

Moreover, in such a case that the wavelength of the ultra-short pulse laser is selected to be 800 nm or shorter and the photosensitive material having photosensitive wavelength of 400 nm or shorter is used, the workability can be greatly improved.

Next, a description will now be made of an image recording material according to an embodiment of the present invention.

Figure 6:
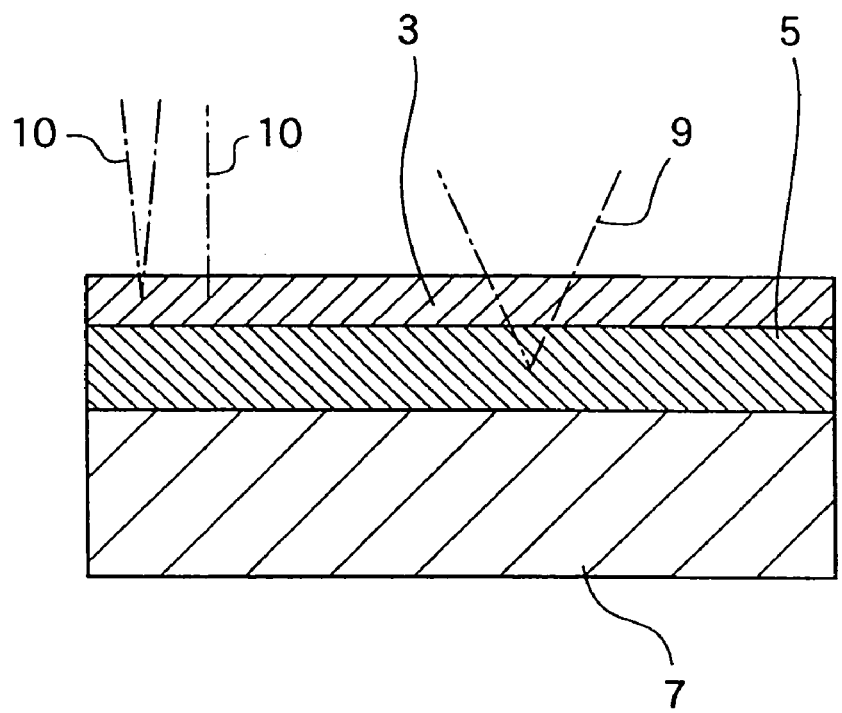
FIG. 6 is a sectional view for schematically showing a structure of an image recording material (photosensitive plate-making material) according to an embodiment of the present invention.

FIG. 6 is a sectional view for schematically showing a structure of an image recording material (photosensitive plate-making material) according to an embodiment of the present invention.

As shown in this drawing, a photosensitive plate-forming material 1 is formed in such a manner that a photopolymer layer 5 is formed on a base plate 7 (base plate 7 is made of aluminum, or resin), and then, an overcoat layer 3 is formed on this photopolymer layer 5. When the recording laser light 9 is selectively irradiated onto the high-sensitive photopolymer layer 5, a multiple photon absorption phenomenon occurs, and thus, this high-sensitive photopolymer layer 5 is selectively hardened. The overcoat layer 3 may cause the recording laser light 9 to pass therethrough, but may reflect, or absorb light 10 having a wavelength shorter than that of this recording laser light 9, so that this light 10 cannot pass through the overcoat layer 3.

As the base plate 7, various sorts of base plates may be freely utilized. These base plates are applied to supporting members for various sorts of photosensitive materials, for instance, plastic base plates such as polyethylene and polypropylene; metal base plates such as aluminum (and its alloy), zinc, and copper; and stacked base plates from plastic, or metals. Among these base plates, an aluminum plate is a suitable base plate, which is employed as a base plate of a so-called PS plate (Pre-Sensitized Plate, photosensitive planographic printing plate). See a document entitled "PS Plate Outline Explanations" written by Teruhiko YONEZAWA, published by Japanese Printing Society Publishing Department). A graining process, a degrease process, a desmut process, an anodizing process and other processes are carried out with respect to the surface of the aluminum plate.

Photopolymer which constitutes the photopolymer layer 5 implies a macromolecular which is changed from monomer to polymer by being irradiated by light. Normally, photopolymer corresponds to such a substance made by adding a sensitizer or polymerization starting agent to monomer having photopolymerization property, prepolymer (namely, dimmer, trimmer, and oligomer) having photopolymerization, or mixtures of these monomer and prepolymer, and copolymer made of these monomer, prepolymer, or mixture (will be referred as representative name "photopolymerization compound" hereinafter).

In particular, as a suitable photopolymerization compound, for instance, an ester containing an unsaturated carboxylic acid and an aliphatic polyhydric alcoholic compound, and an amide containing an unsaturated carboxylic acid and an aliphatic polyhydric amine compound can be mentioned. With respect to detailed description as to such photopolymerization compounds and the sensitizer, the polymerization starting agent, the binders and other additional subjects used in combination with the photopolymerization compounds, and the supporting members, JP-A-5-164982, JP-B-7-13740 and the above-explained publication "PS Plate Outline Explanations" may constitute proper references.

As another useful photopolymer, such a system which contains π conjugated compound having a high sensitivity of two-photon absorption phenomenon as a photo-initiator may be employed. This useful photopolymer is described in WO-98-21521, WO-99-53242, Compston et al, "Two-photon polymerization initiators for three-dimensional optical data storage and microfabrication", Nature, vol. 398, Mar. 4, 1999, pp. 51–54.

Figure 7:
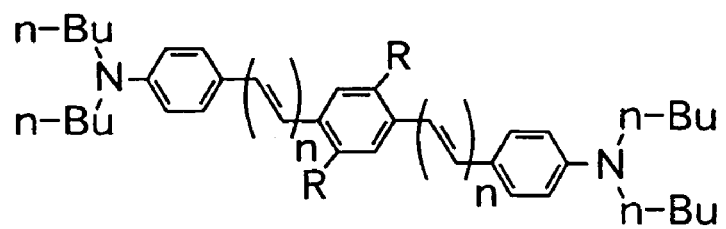
FIG. 7 illustratively shows a chemical structure of one typical example as to a D-π-D compound.
Figure 8A:
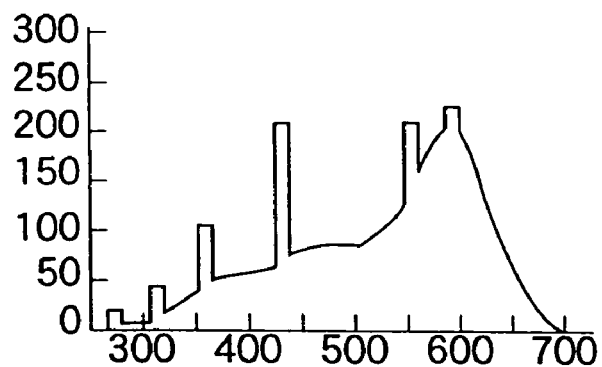
FIGS. 8A–8D are graphic representations for representing spectral characteristics of light emitted from various sorts of fluorescent lamps and also light emitted from incandescent lamps, which are usually used.
Figure 8B:
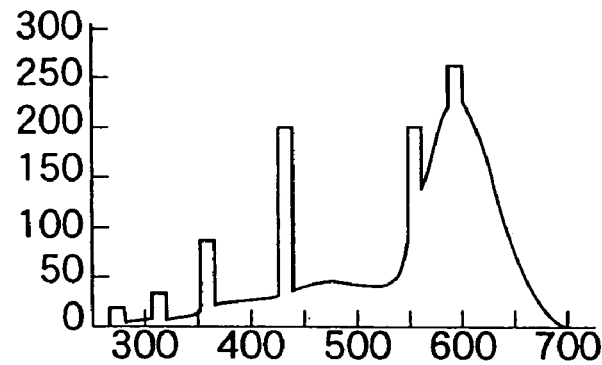
Figure 8C:
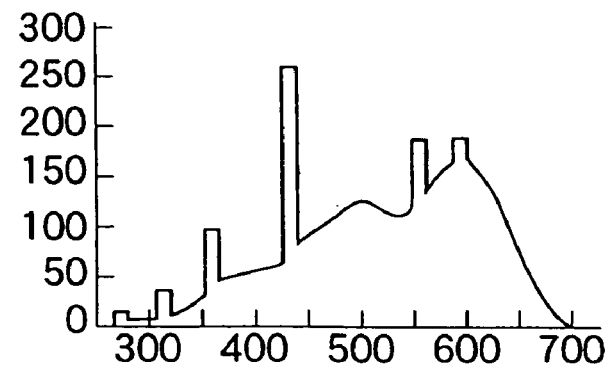
Figure 8D:
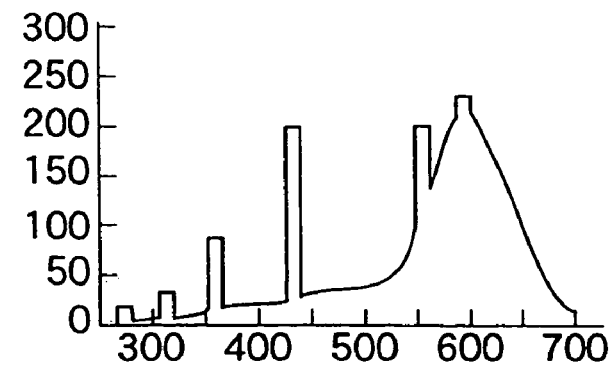

Concretely speaking, the below-mentioned photopolymer composition may be coated as a photosensitive layer on a supporting member made of aluminum or other materials to produce the photosensitive plate to be used in the present invention. The photopolymer composition contains a polymer binder, polymerizable acrylate monomer and D-π-D compound. FIG. 7 shows such a typical D-π-D compound. In this compound, symbol "D" indicates either low ionizing potential atom or a low ionizing potential atom group, which can be coupled to a π conjugated bridge.

As a filter film, substances (dye, pigment etc.) having an absorption function with respect to light having a wavelength of 800 nm or shorter may be solved or dispersed into a coating fluid to be coated as an overcoat layer on a photosensitive layer made of, for instance, a photopolymer composition. As dye and pigment to be used in the invention, it is desirable that λ max is located within a wavelength range shorter than the wavelength of the recording laser beam, and various sorts of compounds containing known substances may be used.

As to dyes known in this chemical field, for instance, azo dye, azomethine dye, indoaniline dye, benzoquinone dye, naphthoquinone dye, anthraquinone dye, diphenylmethane dye, triphenylmethane dye, xanthene dye, acridine dye, azine dye, oxazine dye, thiazine dye, oxo alcohol dye, merocyanine dye, cyanine dye, arylidene dye, styril dye, phthalocyanine dye, perinone dye, indigo dye, thioindigo dye, quinoline dye, nitro dye and nitroso dye may be used.

As to pigments, organic pigments such as azo pigment (insoluble monoazo pigment, insoluble disazo pigment, azolake pigment, condensed azo pigment, metal complex salt azo pigment), phthalocyanine pigment, dyeing lake pigment (acid dye lake, basic dye lake), condensed polycyclic pigment (quinacridone pigment, thioindigo pigment, perylene pigment, anthraquinone pigment, perinone pigment, dioxazine pigment, Isoindolinone pigment, Diketopyrrolopyrrol pigment) and other pigments (nitroso pigment, alizarinlake pigment, alkali blue) may be used.

Concrete compounds are described in "New Edition of Handbook on Dye" (edited by Organic Synthesis Chemistry Institution; Maruzen, 1970), "Colour Index" (edited by The Society of Dyers and Colourists), "Handbook on Color Materials" (edited by Color Material Institution; Asakura bookstore, 1989), "New-Revised Edition of Handbook on Pigment" (edited by Japanese Pigment Technology Institution, published in 1989) and so on.

As to applicable yellow dyes, azo dye containing as a coupling component, for instance, phenol, naphthol, aniline, pyrazolone, pyridone or chain open type activated methylene compound may be used. Further, azomethine dye containing, for instance, chain open type activated methylene compound as a coupling component may be used. Still further, methine dye such as benzylidene dye and monomethine oxo alcohol dye may be used. In addition, naphthoquinone dye, quinophthalone dye, nitro or nitroso dye, acridine dye and acridinone dye may be used.

As to applicable magenta dyes, azo dye containing as a coupling component, for instance, phenol, naphthol or aniline may be used. Further, azomethine dye containing as a coupling component, for instance, pyrazolone or pyrazolotriazole may be used. In addition, methine dye (for instance, arylidene dye, styril dye, merocyanine dye and oxo alcohol dye), diphenylmethane dye, triphenylmethane dye, carbonium dye (for instance, xanthene dye), Dioxazine dye and anthraquinone dye may be used.

As to applicable cyanogen dyes, azomethine dye (for instance, indoaniline dye and indophenol dye), polymethine dye (for instance, cyanin dye, oxo alcohol dye and merocyanine dye), diphenylmethane dye, triphenylmethane dye, carbonium dye (for instance, xanthene dye), phthalocyanine dye, anthraquinone dye and azo dye containing, for instance, dinitrothiophene as a diazo component may be used. Furthrer, indigo or thioindigo dye may be used.

In the present invention, at least two of those dyes may be mixed with each other.

For this embodiment, many pigments sold on the market or many pigments described in various documents may be used. As to such documents, for instance, "Colour Index" (edited by The Society of Dyers and Colourists), "New-Revised Edition of Handbook on Pigment" (edited by Japanese Pigment Technology Institution, published in 1989) "The Newest Pigment Applied Technology" (edited by CMC Publishing, published in 1986), "Printing Ink Technology" (edited by CMC Publishing, published in 1984), "Industrial organic Pigments" (written by W. Herbst and K. Hunger, published by VCH Verlagsgesellschaft in 1993) can be mentioned.

Concretely speaking, organic pigments such as azo pigment (for instance, azolake pigment, insoluble azo pigment, condensed azo pigment and chelateazo pigment), polycyclic pigment (for instance, phthalocyanine pigment, anthraquinone pigment, perylene or perinone pigment, indigo pigment, quinacridone pigment, dioxazine pigment, Isoindolinone pigment, quinophthalone pigment and Diketopyrrolopyrrol dye), dyeing lake pigment (for instance, acid or basic dye lake pigment) and azine pigment, and also inorganic pigments may be used.

In order to obtain fine blue tone, an ultramarine or cobalt blue pigment is desirable such as phthalocyanine pigment, indanthrone pigment of anthraquinone base, triaryl carbonium pigment of dyeing lake pigment base, indigo pigment and inorganic pigment. Furthermore, red or purple pigment, for instance, Dioxazine pigment, quinacridone pigment and Diketopyrrolopyrrol pigment may be used with above-mentioned blue pigment to adjust tone.

Suitable pigments will be mentioned specifically hereinafter.

As blue pigments of phthalocyanine base, for instance, C. I. Pigment Blue 15, C. I. Pigment Blue 15:1, C. I. Pigment Blue 15:2, C. I. Pigment Blue 15:3, C. I. Pigment Blue 15:4, C. I. Pigment Blue 15:6 (copper phthalocyanine), monochloro or low chlorinated copper phthalocyanine, C. I. Pigment Blue 16 (metal free phthalocyanine) and phthalocyanine containing central metal atom of zinc, aluminum or titanium may be used. As blue pigments of indanthrone base, C. I. Pigment Blue 60 also known as vat dye and its halogen substitution products such as C. I. Pigment Blue 64 and C. I. Pigment Blue 21 may be used. Further, C. I. Pigment Blue 25 of azo base, C. I. Pigment Blue 66 of indigo base, C. I. Pigment Blue 63 as lake pigment may be used. In addition, C. I. Pigment Blue 1, C. I. Pigment Blue 2, C. I. Pigment Blue 3, C. I. Pigment Blue 9, C. I. Pigment Blue 10, C. I. Pigment Blue 14, C. I. Pigment Blue 18, C. I. Pigment Blue 19, C. I. Pigment Blue 24:1, C. I. Pigment Blue 24:x, C. I. Pigment Blue 56, C. I. Pigment Blue 61 and C. I. Pigment Blue 62 as lake pigment of triaryl carbonium type acid dye or basic dye may be used.

As red or purple pigments of Dioxazine base, for instance, C. I. Pigment Violet 23 and C. I. Pigment Violet 37 may be used. As red or purple pigments of azo base, for instance, C. I. Pigment Violet 13, C. I. Pigment Violet 25, C. I. Pigment Violet 32, C. I. Pigment Violet 44, C. I. Pigment Violet 50, C. I. Pigment Red 23, C. I. Pigment Red 52:1, C. I. Pigment Red 57:1, C. I. Pigment Red 63:2, C. I. Pigment Red 146, C. I. Pigment Red 150, C. I. Pigment Red 151, C. I. Pigment Red 175, C. I. Pigment Red 176, C. I. Pigment Red 185, C. I. Pigment Red 187 and C. I. Pigment Red 245 may be used. As red or purple pigments of quinacridone base, for instance, C. I. Pigment Violet 19, C. I. Pigment Violet 42, C. I. Pigment Red 122, C. I. Pigment Red 192, C. I. Pigment Red 202, C. I. Pigment Red 207 and C. I. Pigment Red 209 may be used. As lake pigments of triarylcarbonium base, for instance, C. I. Pigment Violet 1, C. I. Pigment Violet 2, C. I. Pigment Violet 3, C. I. Pigment Violet 27, C. I. Pigment Violet 39 and C. I. Pigment Red 81:1 may be used. Further, C. I. Pigment Violet 29 of perylene base, C. I. Pigment Violet 5:1, C. I. Pigment Violet 31 and 33 of anthraquinone base, and C. I. Pigment Red 38 and 88 of thioindigo base may be used too.

In this embodiment, not only above-mentioned raw pigments can be used but also pigments in which surface processing is performed can be used. As methods of processing surfaces of pigments, for instance, a method of coating their surfaces with resin or wax, a method of sticking surface-active agents on their surfaces and a method of combining reactive substance (for instance, silane coupler, epoxy compound, polyisocyanate and so on) with their surfaces are known in this chemical field. Those methods are described in "The Properties of Metallic Soap and Application" (edited by Saiwai Shobou), "Printing Ink Technology" (edited by CMC Publishing, 1984), "The Newest Pigments Applied Technology" (edited by CMC Publishing, 1986) and so on.

In the present invention, pigments are used in a manner in which they are dispersed into binders. As dispersing agents, various agents can be used. For instance, micromolecular dispersing agents of a surface-active agent type or macromolecular dispersing agents can be used in accordance with the binders and pigments. In the case where the dispersing agent is used in hydrophobic binders, the macromolecular disperse agent is preferable in view of the dispersing stability. Concrete examples of dispersing agents are described in JP-A-3-69949, European Patent No. 549,486 and so on.

A suitable grain diameter of the pigment applicable to this embodiment is desirable in a range from 0.01 μm to 10 μm, preferably, in a range from 0.05 μm to 1 μm after being dispersed.

As a method of dispersing a pigment into a binder, known dispersing technologies which are used in making ink or toner can be used. As a dispersing machine, for instance, a sandmill, an attritor, a pearl mill, a Super micron mill, a ball mill, an impeller, a disperser, a Kady mill, a colloid mill, a dynatron, a three roller mill, a pressure kneader and so on can be used. These dispersing machines are described in detail in "The Newest Pigments Applied Technology" (published by CMC Publishing in 1986).

As a typical overcoat layer, it is desired that the overcoat layer contains polyvinyl alcohol or acid cellulose and prevents photopolymer from polymerizing due to the reaction between the photopolymer and oxygen in the air.

To perform a laser exposure in a light room by utilizing the multiple photon absorption phenomenon, recording light is projected to a photosensitive material and this recording light owns such a wavelength "n" times longer than the sensitive wavelength range of the photosensitive material (symbol "n" being any integer larger than, or equal to 2), while illumination light having the above-explained sensitive wavelength range is not projected to the photosensitive material. It should be noted that even when the illumination light contains such light having a wavelength "n" times longer than the photosensitive wavelength range, since the multiple photon absorption phenomenon does not occur under such a light intensity of the illumination light, there is no serious problem. Desirably, a filter film is set on an image recording material which filter film cuts off at least light having the above-explained photosensitive wavelength range and penetrates therethrough light having a wavelength "n" times longer than the photosensitive wavelength range, i.e., two times in the case of the two-photon absorption phenomenon.

Generally speaking, for instance, high-sensitive photopolymer used for printing CTP plates owns such a photosensitive wavelength range which is sensible to near ultraviolet light having wavelengths from 350 nm to 400 nm. In this case, recording light owns a wavelength two times longer than the above-explained wavelength, namely 700 nm to 800 nm. This wavelength belongs to infrared light. As previously described, the filter film merely can cut off the light having the photosensitive wavelength range. However, since a quality of a photosensitive material will be changed if this photosensitive material is exposed for a long time period by a large amount of light having wavelengths other than the photosensitive wavelength range, the following treatment is required. That is to say, even when such light has the wavelength other than the above-explained photosensitive wavelength range, this light should not be projected onto the high-sensitive photopolymer. Under such a circumstance, it is preferable to mount the below-mentioned filter film on the image recording material. This filter film may penetrate therethrough such light having a wavelength not shorter than 700 nm to 800 nm, and may cut off any light having wavelengths shorter than these wavelengths of 700 nm to 800 nm, namely visible light and ultraviolet light.

FIGS. 8A–8D represent spectrum characteristics as to light emitted from various sorts of fluorescent lamps and incandescent lamps, which are used under usual conditions. With respect to various colors of fluorescent lamps, there are peaks in the vicinity of wavelengths of 600 nm and 440 nm, and the emission spectral range is equal to 300 nm to 700 nm. As a result, the filter film may preferably cut off the wavelengths of 300 nm to 700 nm.

In accordance with the present invention, such a photosensitive material can be employed based upon the above-explained basic idea of the multiple photon absorption phenomenon. This photosensitive material owns such a sensitivity with respect to light having a wavelength equal to a half (otherwise shorter than ½) of the wavelength of the recording laser light. In other words, such laser light having the wavelength two times longer than the photosensitive wavelength of the photosensitive material can be employed. As a consequence, the adverse influences of the laser flares which are caused by the diffraction and scattering phenomena of the laser light can be mitigated, which may especially cause a serious problem when the laser light having the short wavelength is employed. Accordingly, the following problems can be considerably solved in the non-image formed portion in the recorded image, or the recorded plate-making material. As these problems, there are colors and films remained in the non-image formed portion, dirty portions of the plate material, thickening of halftone dots and lines, and fringes around the halftone dots.

Also, as explained above, since the occurrence probability (absorption amount) of the multiple photon absorption phenomenon is directly proportional to the squared light intensity (otherwise, more than 2), the focal point of the laser light can be narrowed, so that the multiple photon absorption phenomenon may occur only the area in the vicinity of this focal point so as to expose the photosensitive material. As a consequence, the high resolution can be achieved.

The invention claimed is:

1. A plate-making method comprising the steps of:
preparing a photosensitive plate-making material;
scanning said photosensitive plate-making material by using modulated laser light so as to record an image on said photosensitive plate-making material, said laser light including ultra-short pulse laser light which causes photopolymerization reaction by a multiple photon absorption phenomenon at a laser-light-irradiated portion of said photosensitive plate-making material; and
developing said image recorded on said photosensitive plate-making material.

2. A plate-making method according to claim 1 wherein:
a pulse width of said ultra-short pulse laser light is not longer than 10 ps.

3. A plate-making method according to claim 1 wherein:
a wavelength of said ultra-short pulse laser light is not longer than 800 nm; and
a photosensitive wavelength of said photosensitive plate-making material is not longer than 400 nm.

4. A plate-making method according to claim 1 wherein:
said photosensitive plate-making material includes a photosensitive layer made of photopolymer on a supporting member, said photopolymer including a compound that changes from monomer to polymer by being irradiated with the laser light.

5. A plate-making method according to claim 2 wherein:
said photosensitive plate-making material includes a photosensitive layer made of photopolymer on a supporting member, said photopolymer including a compound that changes from monomer to polymer by being irradiated with the laser light.

6. A plate-making method according to claim 3 wherein:
said photosensitive plate-making material includes a photosensitive layer made of photopolymer on a supporting member, said photopolymer including a compound that changes from monomer to polymer by being irradiated with the laser light.

* * * * *